United States Patent
Fischer et al.

(10) Patent No.: US 11,247,229 B2
(45) Date of Patent: Feb. 15, 2022

(54) METHOD FOR COATING A SUBSTRATE WITH A LACQUER AND DEVICE FOR PLANARISING A LACQUER LAYER

(71) Applicant: SUSS MicroTec Lithography GmbH, Garching (DE)

(72) Inventors: Katrin Fischer, Stuttgart (DE); Florian Palitschka, Gauting (DE); Johannes Platen, Kevelaer-Wetten (DE); Kento Kaneko, Munich (DE)

(73) Assignee: SUSS MICROTEC LITHOGRAPHY GMBH, Garching (DE)

(*) Notice: Subject to any disclaimer, the term of this patent is extended or adjusted under 35 U.S.C. 154(b) by 79 days.

(21) Appl. No.: 16/256,280

(22) Filed: Jan. 24, 2019

(65) Prior Publication Data
US 2019/0151889 A1    May 23, 2019

Related U.S. Application Data

(62) Division of application No. 14/861,105, filed on Sep. 22, 2015, now Pat. No. 10,232,405.

(30) Foreign Application Priority Data

Sep. 25, 2014  (DE) .................. 102014113928.3

(51) Int. Cl.
*B05D 3/04* (2006.01)
*B05D 3/02* (2006.01)
(Continued)

(52) U.S. Cl.
CPC .............. *B05D 3/0453* (2013.01); *B05C 9/12* (2013.01); *B05D 3/0254* (2013.01); *B05D 3/046* (2013.01);
(Continued)

(58) Field of Classification Search
CPC .. B05C 9/12; B05C 9/14; B05C 5/001; G03F 7/16; G03F 7/168
See application file for complete search history.

(56) References Cited

U.S. PATENT DOCUMENTS 4,794,021 A * 12/1988 Potter ................. G03F 7/168
                                                  427/240
5,604,380 A    2/1997 Nishimura et al.
(Continued)

FOREIGN PATENT DOCUMENTS

CN       1662354 A     8/2005
CN       1900823 A     1/2007
(Continued)

OTHER PUBLICATIONS

Sinturel et al., "Solvent Vapor Annealing of Block Polymer Think Films," Macromolecules 2013, 46, pp. 5399-5415 (Year: 2013).*
(Continued)

*Primary Examiner* — Dah-Wei D. Yuan
*Assistant Examiner* — Stephen A Kitt
(74) *Attorney, Agent, or Firm* — Hayes Soloway PC

(57) ABSTRACT

The disclosure relates to a method for coating a substrate with a lacquer. First, the lacquer is uniformly applied to the substrate. Then, the solvent proportion of the lacquer applied to the substrate is reduced, and the coated substrate is exposed to a solvent atmosphere. In some embodiments, the lacquer is heated. The invention also relates to a device for planarising a lacquer layer.

6 Claims, 2 Drawing Sheets

(51) Int. Cl.
*G03F 7/16* (2006.01)
*B05C 9/12* (2006.01)
*G03F 7/00* (2006.01)
*B05D 3/10* (2006.01)
*B05D 7/04* (2006.01)
*B05D 5/00* (2006.01)
*B05D 7/26* (2006.01)

(52) U.S. Cl.
CPC ......... *B05D 3/0466* (2013.01); *B05D 3/0473* (2013.01); *B05D 3/0486* (2013.01); *B05D 3/0493* (2013.01); *B05D 3/107* (2013.01); *B05D 5/00* (2013.01); *B05D 7/04* (2013.01); *B05D 7/26* (2013.01); *G03F 7/00* (2013.01); *G03F 7/16* (2013.01); *G03F 7/168* (2013.01)

(56) References Cited

U.S. PATENT DOCUMENTS

| | | | |
|---|---|---|---|
| 7,700,489 | B2 | 4/2010 | Matsui et al. |
| 2001/0001407 | A1 | 5/2001 | You et al. |
| 2001/0055731 | A1* | 12/2001 | Irie ................... G03F 7/38 430/313 |
| 2002/0150691 | A1 | 10/2002 | Kitano et al. |
| 2012/0315578 | A1* | 12/2012 | Lee ................... G03F 7/162 430/270.1 |

FOREIGN PATENT DOCUMENTS

| | | |
|---|---|---|
| CN | 103524770 A | 1/2014 |
| DE | 10351963 A1 | 6/2005 |
| JP | S59166958 A | 9/1984 |
| JP | S6230581 A | 2/1987 |
| JP | S62219923 A | 9/1987 |
| JP | S63185028 A | 7/1988 |
| JP | H01238017 A | 9/1989 |
| JP | 01248529 A | 10/1989 |
| JP | H03293057 A | 12/1991 |
| JP | H11220905 A | 8/1999 |
| JP | 2002043307 A | 2/2002 |
| JP | 2004225147 A | 8/2004 |
| JP | 2005011996 A | 1/2005 |
| JP | 4602699 B2 | 12/2005 |
| JP | 2005334810 A | 12/2005 |
| JP | 2006100090 A | 4/2006 |
| JP | 200833357 A | 2/2010 |
| TW | 326550 B | 2/1998 |
| WO | 2010053125 A1 | 5/2010 |
| WO | 2013083129 A1 | 6/2013 |

OTHER PUBLICATIONS

Bacchetta et al.; "A SOG based planarization scheme compatible with a stacked via multi-level metal process" SPIE vol. 2090 Multilevel Interconnection (1993), 72-84. (Year: 1993).

Fu et al.; "High field-effect mobility from poly(3-hexylthiophene) thin-film transistors by solvent-vapor-induced reflow" Organic Electronics 10 (2009) 883-888. (Year: 2009).

Sinturel et al.; "Solvent Vapor Annealing of Block Polymer Thin Films"; Macromolecules 2013,46, 5399-5415. (Year: 2013).

Bornside; "Mechanism for the Local Planarization of Microscopically Rough Surfaces by Drying Thin Films of Spin-Coated Polymer/Solvent Solutions"; J. Electrochem. Soc., vol. 137, No. 8, Aug. 1990, 2589-2595. (Year: 1990).

Zhang Yafei et al., "Microfabrication Technology of Semiconductor Integrated Circuits", 2006, China Higher Education Press, pp. 109-112.

Zhong Pinghai et al., "Production Technology of Biochemicals", 2006, Ziangxi Science and Technology Press, pp. 101-102.

* cited by examiner

METHOD FOR COATING A SUBSTRATE WITH A LACQUER AND DEVICE FOR PLANARISING A LACQUER LAYER

CROSS REFERENCE TO RELATED APPLICATIONS

This application is a Divisional of U.S. patent application Ser. No. 14/861,105 filed Sep. 22, 2015, which claims the right of priority based on German application serial no. 10 2014 113 928.3, filed Sep. 25, 2014, which is incorporated by reference in its entirety.

BACKGROUND

The disclosure herein relates to a method for coating a substrate with a lacquer and to a device for planarising a lacquer layer on a substrate.

Micro- and nano-fabrication processes typically use lacquers which are applied in a layer onto the substrate to be processed. With the aid of these lacquers it is possible to produce e.g. masks on the substrates, with the aid of which a desired structure can be produced or processing can be effected on the substrate. For this purpose, the lacquers are e.g. light-sensitive so that the desired structure can be transmitted from a photo-mask to the light-sensitive lacquer with the aid of optical imaging.

In order to achieve optimum results, it is extremely important that the applied lacquer layer is free of any irregularities and particles. In addition to rotation methods, spraying methods are also used for applying the lacquer onto the substrate, in which spraying methods the lacquer is sprayed onto the substrate by means of a nozzle. Particularly in the case of substrates having topographies, i.e. substrates which themselves already have vertical, three-dimensional structures on their surface, the most homogeneous possible lacquer layer can be achieved in an economical manner only by spraying-on the lacquer.

However, when the lacquer is sprayed on, lacquer particles form on the lacquer layer, as a certain number of lacquer drops dry in flight between the nozzle and the substrate and then impinge already as (almost) cured lacquer particles upon the surface of the substrate or the lacquer present at this location. These lacquer particles collect on the sprayed-on lacquer layer and lead to problems during further processing, e.g. during exposure to light, and ultimately lead to local defects on the structures produced.

SUMMARY

Disclosed are a method and an apparatus in which the lacquer layer applied on the substrate is even and free of lacquer particles. This is achieved by coating a substrate with a lacquer in which the lacquer is applied uniformly to the substrate and then the solvent proportion of the lacquer applied to the substrate is reduced and subsequently the coated substrate is exposed to a solvent atmosphere. Since the coated substrate is exposed to a solvent atmosphere the lacquer particles which have been formed on the substrate are dissolved. However, since the solvent proportion of the substrate has previously been reduced, it is ensured that the lacquer applied to the substrate does not flow further or begins to flow again even during handling in a solvent atmosphere. It is thus ensured that the substrate remains completely coated with lacquer even at steeply inclined points of a topography which may be provided.

Up to the point of and during the time the substrate is exposed to the solvent atmosphere, the solvent proportion of the applied lacquer must be kept in a range in which the viscosity of the applied lacquer is sufficiently high to ensure that the lacquer no longer flows. At the same time, the solvent proportion must not have been reduced such that the lacquer particles or irregularities can no longer be dissolved by the solvent atmosphere.

The term "lacquer" in this connection is understood to be a mixture of a solvent and a lacquer suitable for the desired application.

After it has been exposed to the solvent atmosphere, the coated substrate is preferably heated, whereby the applied lacquer is subjected to a soft bake. The soft bake reduces the solvent proportion of the lacquer so much that the lacquer is fully hardened and can be processed further, e.g. exposed to light.

The coated substrate can be exposed to a vacuum in order to reduce the solvent proportion of the lacquer applied to the substrate in the desired manner. In this way a part of the volatile solvent evaporates, and so the viscosity of the lacquer is increased.

A vacuum is understood to be a pressure of less than 0.3 bar.

In one embodiment variation the coated substrate is heated in order to reduce the solvent proportion of the lacquer applied to the substrate, whereby the viscosity of the lacquer is likewise increased.

In one embodiment of the invention the solvent atmosphere has a solvent proportion of at least 50 mol. %, in particular at least 70 mol. %. These values have proved particularly suitable in dissolving and thereby removing irregularities and lacquer particles on the applied lacquer.

The solvent can be acetone or methyl ethyl ketone, whereby inexpensive known solvents can be used.

In one embodiment of the invention the temperature of the solvent atmosphere is above the boiling point of the solvent, whereby condensation of the solvent is prevented, which can lead to undesired solvent droplets. These droplets are undesirable because they can drip in an uncontrolled manner onto the coated lacquer and spoil the lacquer layer.

For example, the pressure of the solvent atmosphere is greater than or equal to 0.5 bar, in particular greater than or equal to 0.7 bar, whereby reliable removal of the lacquer particles and irregularities is ensured.

The coated substrate can be exposed to the solvent atmosphere for 480 s or less, in particular for 420 s or less. This period of time is long enough for the lacquer particles to be dissolved and the irregularities to be evened out but short enough for the applied lacquer not to start dissolving again and to begin to flow.

In one embodiment variation of the invention the lacquer is applied uniformly to the substrate by spraying, whereby the substrate can be uniformly coated in a tried and tested manner even if the substrate has topographies.

The object is further achieved by a device for planarising a lacquer layer on a substrate, having a treatment chamber, a drying device which is designed to reduce the solvent proportion of the lacquer layer, and an evaporator which can produce a solvent atmosphere in the treatment chamber. The device makes it possible to dry a lacquer layer, i.e., to reduce the solvent proportion of the lacquer so much that it no longer flows. In addition, irregularities and lacquer particles on the lacquer layer can be removed by the solvent atmosphere.

Thus the term "evaporator" is not limited to devices which produce a gas from solids or liquids. The term also includes other devices able to produce a solvent atmosphere in the treatment chamber, such as, e.g., a gas storage container with an appropriate valve.

Preferably the device has a coating device which can apply the lacquer layer to the substrate uniformly, in particular can spray it. In this way, in a tried and tested manner, a uniform lacquer layer can be produced on substrates, in particular on substrates with topographies.

For example, the drying device has a vacuum pump and/or at least one venturi nozzle which can produce a vacuum in the treatment chamber so that solvent evaporates from the applied lacquer layer and the solvent proportion of the lacquer layer is reduced.

In one embodiment variation the drying device is a heating device which can heat the lacquer layer and so the solvent proportion of the applied lacquer layer is likewise reduced.

In one embodiment of the invention the device has a heating system which can heat the atmosphere in the treatment chamber, whereby the temperature of the atmosphere in the treatment chamber can be controlled. For example, by means of this heating system the applied lacquer layer can also be heated.

In one embodiment of the invention the evaporator produces a solvent atmosphere with a solvent proportion of at least 50 mol. %, in particular at least 70 mol. %, whereby a solvent concentration in the atmosphere is ensured which is sufficiently high to level out irregularities and dissolve lacquer particles.

BRIEF DESCRIPTION OF THE DRAWINGS

Further features and advantages of the invention will be apparent from the following description and the enclosed drawings to which reference is made. In the drawings.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Figure 1:
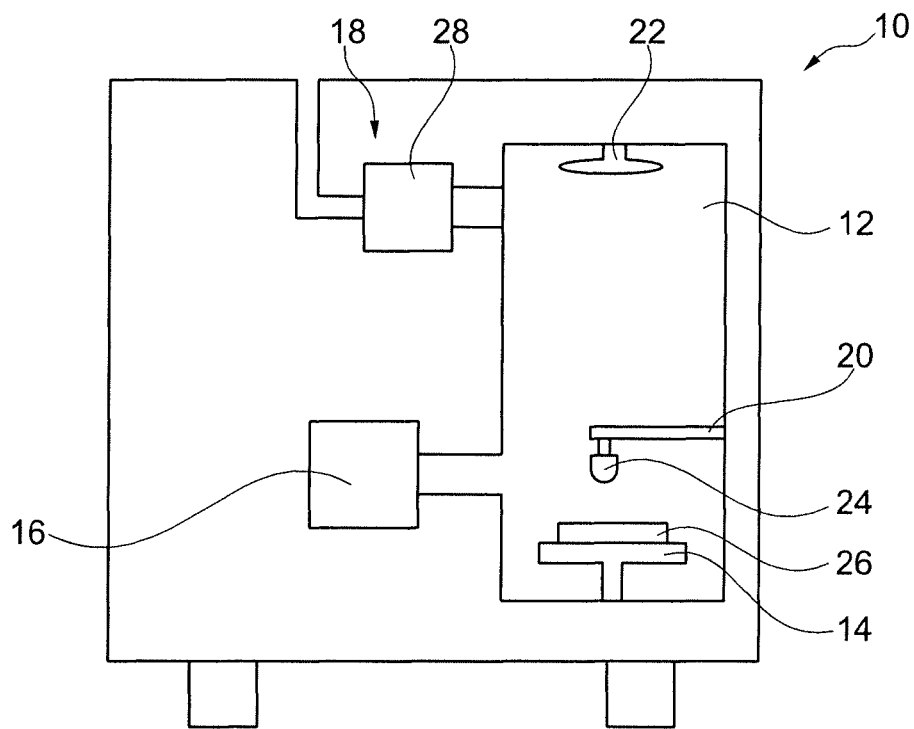
FIG. 1 shows a schematic view of a device in accordance with the invention according to a first embodiment of the invention.

FIG. 1 schematically illustrates a device 10 which is used for coating and treating a substrate. The substrate is, e.g., a semiconductor which is subsequently further processed. The device 10 has a treatment chamber 12 in which a substrate holder 14 is provided. An evaporator 16 and a drying device 18 are connected to the treatment chamber 12. In addition, in the embodiment shown the device 10 is provided with a coating device 20.

The device 10 also has a heating system 22 which is arranged in the treatment chamber 12 and which can heat the atmosphere within the treatment chamber 12. The heating system 22 can be formed, e.g., by heating rods or coils in the treatment chamber 12.

In the illustrated embodiment, the coating device 20 has a nozzle 24 with which a substrate 26 disposed on the substrate holder 14 can be uniformly sprayed with lacquer.

In the embodiment of FIG. 1, the drying device 18 has a vacuum pump 28 which is in fluid communication with the treatment chamber 12 and can evacuate this chamber. For example, the vacuum pump 28 can reduce the pressure in the treatment chamber 12 to 0.2 bar.

Furthermore, the drying device 18 can have at least one venturi nozzle for evacuation of the treatment chamber 12.

The evaporator 16 is formed in such a way that it can produce a solvent atmosphere in the treatment chamber 12. For this purpose it is likewise in fluid communication with the treatment chamber 12.

The evaporator 16 can have e.g. a gas-washing bottle filled with solvent, through which bottle a gas stream, in particular a nitrogen stream, is fed, whereby the solvent is evaporated. The evaporated solvent is then introduced into the treatment chamber 12 together with the nitrogen.

Of course, a solvent atmosphere can be provided in other ways, e.g., thermal or mechanical evaporation of solvent or the use of a solvent reservoir in which a solvent is provided in gaseous form.

The solvent proportion of the solvent atmosphere produced by the evaporator 16 is at least 50 mol. %, in particular at least 70 mol. %.

The solvent is, e.g., acetone or methyl ethyl ketone.

Figure 3A:
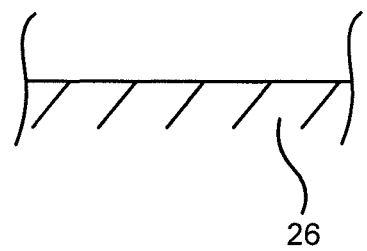
FIG. 3a schematically shows a sectional view of a substrate prior to being coated with lacquer in accordance with an embodiment.
Figure 3B:
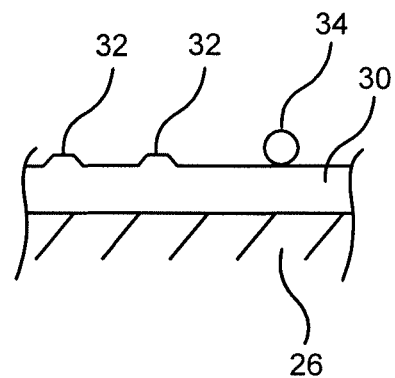
FIG. 3b schematically shows a sectional view of a substrate that has been coated with lacquer in accordance with an embodiment.
Figure 3C:
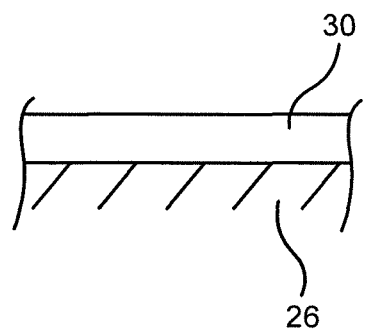
FIG. 3c schematically shows a sectional view of a substrate that has been coated with lacquer and exposed to a solvent atmosphere in accordance with an embodiment.

The method, which is carried out with the aid of the device, for coating a substrate with lacquer and planarising the lacquer layer applied to the substrate 26 is described hereinunder with the aid of FIGS. 3a to 3c.

FIG. 3 shows a schematic cross-sectional view of a section of a substrate 26 to be coated. At the beginning of the method the substrate 26 is uncoated and free of dirt.

The shown substrate 26 is in this case shown in a planar manner for simplification. However, the method in accordance with the invention can likewise be applied to substrates which have vertical, three-dimensional topographies.

With the aid of the coating device 20 the lacquer, which is a mixture of the lacquer suitable for the desired application and a solvent, is applied uniformly to the substrate 26, e.g., by spraying.

FIG. 3b illustrates the substrate 26 with an applied lacquer layer 30.

It can be seen that the lacquer in this case has local irregularities 32. Lacquer particles 34 can also collect on the lacquer layer 30. These lacquer particles 34 can be formed e.g. in that individual lacquer droplets produced by the nozzle 24 dry and form hollow spheres as they are in flight to the substrate 26.

Both the lacquer particles 34 and also the irregularities 32 are undesirable since they can impair the quality of the further nano or micro fabrication process.

In order to remove the irregularities 32 and lacquer particles 34 the lacquer applied to the substrate 26, i.e., the lacquer layer 30, is dried, whereby the solvent proportion of the lacquer layer 30 is reduced.

This can take place in that the treatment chamber 12 is evacuated by means of the vacuum pump 28 and/or venturi nozzle. For example, a pressure of 0.2 bar can be produced in the treatment chamber 12. The coated substrate 26 is therefore exposed to a vacuum.

Parts of the solvent of the lacquer are evaporated by the negative pressure and so the solvent proportion of the lacquer layer 30 is reduced. The lacquer layer 30 with the reduced solvent proportion now has an increased viscosity and so the lacquer layer 30 can no longer flow.

This is significant in particular for substrates with topographies since an excessively liquid lacquer would flow into recesses and depressions in the substrate and so higher corners and edges would remain without a sufficient lacquer layer.

Subsequently with the aid of the evaporator 16 gaseous solvent, e.g. acetone or methyl ethyl ketone is then introduced into the treatment chamber 12 and so a solvent atmosphere is formed in the treatment chamber 12.

It has proved particularly suitable to use a solvent proportion in the solvent atmosphere of at least 50 mol. % and in particular at least 70 mol. %.

The pressure of the solvent atmosphere is preferably greater than or equal to 0.5 bar, in particular greater than or equal to 0.7 bar.

If necessary, with the aid of the heating system 22 the treatment chamber 12 can be heated so that the temperature of the solvent atmosphere is increased, e.g. to a temperature above the boiling temperature of the solvent.

The solvent atmosphere in the treatment chamber 12 acts on the lacquer layer for a few minutes. A dwell time of not more than 480 s has proved particularly suitable, particularly preferably not more than 420 s.

Thus the beginning or end of the time for which the substrate 26 is exposed to the solvent atmosphere can be defined in that the solvent proportion of the solvent atmosphere exceeds or falls below a specific value, e.g., 50 mol. % or 70 mol. %.

After the coated substrate 26 with the lacquer layer 30 has been exposed to the solvent atmosphere, the solvent atmosphere is removed from the treatment chamber 12. This happens e.g., in that the treatment chamber 12 is flushed with an inert gas, e.g., nitrogen. This step can, however, also take place with the aid of the vacuum pump 28 and/or venturi nozzle.

The irregularities 32 have been leveled out and the lacquer particles 34 on the lacquer layer 30 have been dissolved by the gaseous solvent in the solvent atmosphere and so a homogeneous and planar surface of the lacquer layer 30 is produced. The lacquer layer 30 is thus (almost) free of irregularities 32 and lacquer particles 34. The substrate 26 after exposure to the solvent atmosphere is shown in FIG. 3c.

The coated substrate 26 with the lacquer layer 30 can now be heated and so the lacquer layer 30 is subjected to a soft bake.

The coated substrate 26 with the lacquer layer 30 can then be further processed e.g. exposed to light.

The pressure, the temperature and the solvent proportion of the solvent atmosphere and the time for which the substrate is exposed to the solvent atmosphere, and further parameters are given by way of example and must, e.g., be adapted to the solvent used and the lacquer used in order to achieve optimal results.

Figure 2:
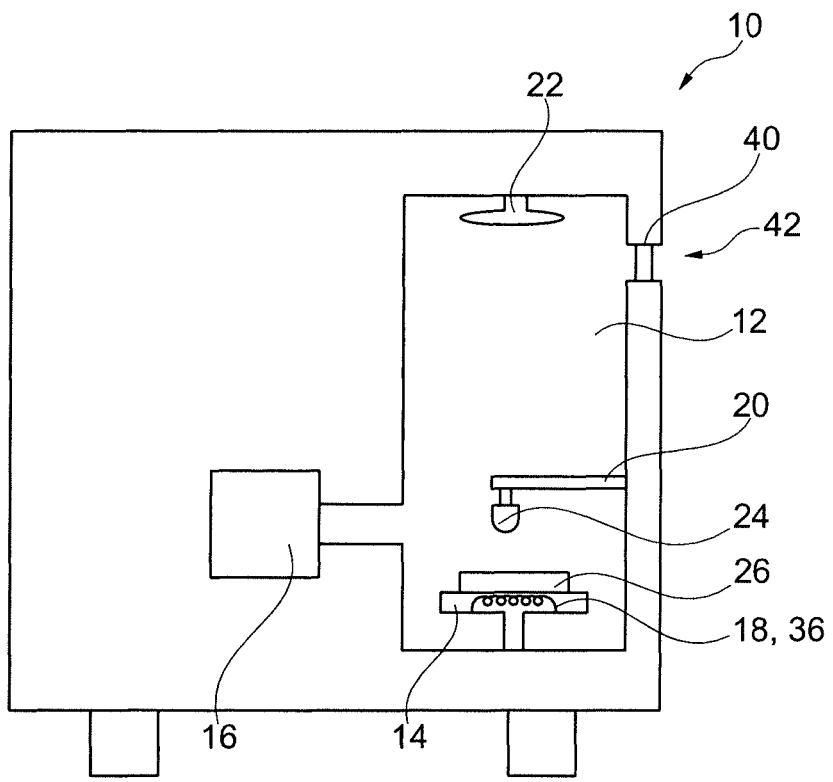
FIG. 2 shows a schematic view of a device in accordance with the invention according to a second embodiment of the invention.

FIG. 2 shows a second embodiment of the device 10. It corresponds essentially to the first embodiment according to FIG. 1 and so like and functionally equivalent parts are designated by the same reference signs. Only the differences will be discussed hereinunder.

The drying device 18 of the device 10 of the second embodiment has no vacuum pump but rather a heating device 36.

The heating device 36 is provided, e.g., in the substrate holder 14 and can heat the substrate 26 and a lacquer layer 30 which may be applied thereto.

The method carried out by means of the device 10 in accordance with the second embodiment likewise essentially corresponds to the method already described. However, the solvent proportion of the lacquer applied to the substrate 26, i.e., the lacquer layer 30, is reduced in another way.

The heating device 36 heats the coated substrate 26 with the lacquer layer 30 and so the solvent in the lacquer layer 30 is partially evaporated, whereby the solvent proportion of the lacquer layer 30 is reduced.

Furthermore, the solvent atmosphere produced in the treatment chamber 12 can be discharged from the treatment chamber 12 by means of a fan 40 which is provided in a venting shaft between the treatment chamber 12 and the surroundings of the device 10.

Of course, the features of the illustrated embodiments can be combined with one another as desired. For example, it is feasible for the device 10 to comprise both a heating device 36 and also a vacuum pump 28. It is thereby possible to produce an extremely pure solvent atmosphere since the treatment chamber 12 can be evacuated before the solvent atmosphere is introduced into the treatment chamber 12.

It is likewise feasible for the heating device 36 and the heating system 22 to be formed by these same heating elements and so, with these heating elements, both the treatment chamber 12 and therefore the solvent atmosphere as well as the coated substrate 26 can be heated.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Persons skilled in the relevant art can appreciate that many modifications and variations are possible in light of the above disclosure. Accordingly, the disclosure of the embodiments of the invention is intended to be illustrative, but not limiting, of the scope of the invention, which is set forth in the following claims.

What is claimed is:

1. A device for planarising a lacquer layer on a substrate, the device comprising:
   a treatment chamber;
   a drying device configured to reduce a solvent proportion of the lacquer layer;
   an evaporator disposed to produce a solvent atmosphere in the treatment chamber; and
   a coating device configured to apply the lacquer uniformly to the substrate, wherein the coating device is arranged in the treatment chamber;
   wherein the evaporator is configured to produce the solvent atmosphere after the solvent proportion of the lacquer applied to the substrate has been reduced by the drying device such that the lacquer applied to the substrate by the coating device is not allowed to flow again and such that the lacquer coating is produced free from irregularities and lacquer particles.

2. The device of claim 1, wherein the drying device further comprises a vacuum pump configured to produce a vacuum in the treatment chamber.

3. The device of claim 1, wherein the drying device further comprises a heating device configured to heat the lacquer layer.

4. The device of claim 1, further comprising a heating system disposed for atmospheric heating of the treatment chamber.

5. The device of claim 1, wherein the evaporator is configured to produce a solvent atmosphere with a solvent proportion of at least 50 mol. %.

6. The device of claim 1, wherein the evaporator is configured to produce a solvent atmosphere with a solvent proportion of at least 70 mol. %.

* * * * *